(12) United States Patent
Verheyen

(10) Patent No.: US 11,309,692 B2
(45) Date of Patent: Apr. 19, 2022

(54) WIRELESS MONITORING AND CONFIGURATION TETHER FOR USE WITH ISOLATED INDUSTRIAL PRODUCT AND METHOD OF OPERATION THEREOF

(71) Applicant: Eaton Intelligent Power Limited, Dublin (IE)

(72) Inventor: Mark Alan Verheyen, Whitefish Bay, WI (US)

(73) Assignee: Eaton Intelligent Power Limited, Dublin (IE)

( * ) Notice: Subject to any disclaimer, the term of this patent is extended or adjusted under 35 U.S.C. 154(b) by 10 days.

(21) Appl. No.: 16/608,952

(22) PCT Filed: May 2, 2018

(86) PCT No.: PCT/EP2018/061188
§ 371 (c)(1),
(2) Date: Oct. 28, 2019

(87) PCT Pub. No.: WO2018/202701
PCT Pub. Date: Nov. 8, 2018

(65) Prior Publication Data
US 2020/0185892 A1 Jun. 11, 2020

Related U.S. Application Data

(60) Provisional application No. 62/492,342, filed on May 1, 2017.

(51) Int. Cl.
*H02B 1/30* (2006.01)
*G08C 17/02* (2006.01)
(Continued)

(52) U.S. Cl.
CPC ............. *H02B 1/306* (2013.01); *G08C 17/02* (2013.01); *G08C 17/04* (2013.01); *G08C 23/04* (2013.01); *H02B 1/36* (2013.01); *H04B 5/0037* (2013.01)

(58) Field of Classification Search
CPC .......... H02B 1/306; H02B 1/36; G08C 17/02; G08C 17/04; G08C 23/04; H04B 5/0037; G01R 31/34
See application file for complete search history.

(56) References Cited

U.S. PATENT DOCUMENTS

| 4,194,178 A | 3/1980 | Dumbeck |
| 6,133,723 A | 10/2000 | Feight |

(Continued)

FOREIGN PATENT DOCUMENTS

| CN | 1643826 A | 7/2005 |
| CN | 101901953 A | 12/2010 |

(Continued)

OTHER PUBLICATIONS

Office Action, counterpart Chinese Patent Application No. 201880026722.0, dated Jul. 23, 2021, 45 pages total (including English translation of 23 pages).

*Primary Examiner* — Yuwen Pan
*Assistant Examiner* — Fatuma G Sherif
(74) *Attorney, Agent, or Firm* — DiBerardino McGovern IP Group LLC

(57) ABSTRACT

A portable tether device for configuring and/or monitoring an isolated industrial product includes an outer housing defining a chamber, a magnet positioned within the chamber to provide for magnetic attachment of the portable tether device to a housing panel, and an inductive receive coil positioned within the chamber and adjacent an underside of the outer housing, the inductive receive coil operable with an external inductive charging coil to provide inductive pow- (Continued)

ering to the portable tether device. The portable tether device also includes a communication circuit positioned within the chamber and powered by the inductive receive coil, with the communication circuit further including transmit and receive optical components that provide light-based communication between the portable tether device and the isolated industrial product and wireless communication circuitry configured to transmit and receive wireless signals to and from the portable tether device.

22 Claims, 4 Drawing Sheets

(51) Int. Cl.
*G08C 17/04* (2006.01)
*G08C 23/04* (2006.01)
*H02B 1/36* (2006.01)
*H04B 5/00* (2006.01)

(56) References Cited

U.S. PATENT DOCUMENTS

| | | | |
|---|---|---|---|
| 7,030,773 | B2 | 4/2006 | Peterson et al. |
| 2004/0198101 | A1 | 10/2004 | Rapp |
| 2008/0079436 | A1 | 4/2008 | Gollhardt et al. |
| 2009/0285578 | A1 | 11/2009 | Machida |
| 2010/0085677 | A1 | 4/2010 | Rivers, Jr. et al. |
| 2012/0081841 | A1 | 4/2012 | Blodorn et al. |
| 2013/0279081 | A1 | 10/2013 | Feldmeier et al. |
| 2014/0247132 | A1 | 9/2014 | Fukuma et al. |
| 2014/0268542 | A1 | 9/2014 | Moon |
| 2015/0163881 | A1* | 6/2015 | Pederson ............ H04B 10/1143 315/154 |
| 2015/0220109 | A1* | 8/2015 | von Badinski ........ A61B 5/349 340/539.12 |
| 2016/0164575 | A1* | 6/2016 | Smith .................... G08C 17/06 455/41.1 |

FOREIGN PATENT DOCUMENTS

| | | |
|---|---|---|
| CN | 103297137 A | 9/2013 |
| CN | 103763410 A | 4/2014 |
| CN | 103930851 A | 7/2014 |
| CN | 104053079 A | 9/2014 |
| CN | 105024752 A | 11/2015 |
| CN | 106104408 A | 11/2016 |
| CN | 206040939 U | 3/2017 |
| WO | 2008042052 A2 | 4/2008 |
| WO | 2014127288 A1 | 8/2014 |
| WO | 2016205295 A1 | 12/2016 |
| WO | 2017036895 A1 | 3/2017 |

* cited by examiner

WIRELESS MONITORING AND CONFIGURATION TETHER FOR USE WITH ISOLATED INDUSTRIAL PRODUCT AND METHOD OF OPERATION THEREOF

BACKGROUND OF THE INVENTION

Embodiments of the invention relate generally to a wireless communications system for configuring and monitoring industrial products and, more particularly, to a wireless communications tether securable to an outer enclosure of a system or device and communicates with the device through an enclosure mounted communication interface.

In industrial facilities, electrical machines such as generators, AC motors, and/or transformers are used in various applications. As one example, induction motors are used for applications like pumping, cooling, material movement, and other applications where cost-efficient and robust motors are required. For controlling such electrical machines, various motor control and motor protection components such as motor controllers, starters, contactor assemblies, overload relays, circuit breakers, motor circuit protectors, various disconnects, and similar devices for operating low voltage motors are provided. These motor control and motor protection components are typically provided as part of a motor control center. The motor control center may be in the form of a multi-compartment steel enclosure with a bus system to distribute electrical power, on a common bus system, to the individual motor control units, which are mountable within the compartments. The individual motor control units are commonly referred to as "buckets" and are typically constructed to be removable, pull-out units that have or are installed behind individual sealed doors on the motor control center enclosure. The buckets connect to the supply power lines of the motor control center and conduct supply power to the line side of the motor control devices, for operation of the electrical machines.

In order to provide for configuring and monitoring of the various motor control and motor protection components in the motor control center, mobile user interfaces (UIs) of known types are typically provided. These mobile UIs may communicate with the motor control and motor protection components in the motor control center via a number of known wireless communication protocols, with Bluetooth communication comprising short-wavelength UHF radio waves in the ISM band from 2.4 to 2.485 GHz being one such exemplary communication protocol. Such Bluetooth communications may be established via a dongle or other Bluetooth device that is plugged into a sub-unit of the motor control center, such as via a RJ45 port or similar connection port for example.

However, it is recognized that existing methods for configuring and monitoring of motor control and motor protection components in a motor control center, or in industrial settings in general (where the number of components may range from 20-100 components, for example) may have a number of shortcomings and limitations. For example, due to the clustering of products that is typical in a motor control center environment, Bluetooth is challenged by the number of secure pairing operations that would be necessary to connect to a plurality of devices/components individually. As another example, it is recognized that electrical machines and motor control centers employed in industrial setting may experience harsh environmental conditions, such that a common dongle or other Bluetooth device that plugs into a corresponding port requires additional protection from the environment, such as a cap or cover, that adds to the cost and complexity of the system overall.

It would therefore be desirable to provide a portable tether device that allows for secure pairing operations for each of a plurality of devices/components, without requiring individual connections to every device component. It would also be desirable for such a portable tether device to provide such communications to an isolated system without requiring direct electrical connections thereto, so as to negate the need for adding additional environmental protections.

BRIEF DESCRIPTION OF THE INVENTION

The present invention provides a system and method for configuring and monitoring industrial products via a portable tether device. The tether device provides communications to an isolated product without requiring direct electrical connections thereto.

In accordance with one aspect of the present invention, a portable tether device for configuring and/or monitoring an isolated industrial product includes an outer housing defining a chamber, a magnet positioned within the chamber to provide for magnetic attachment of the portable tether device to a housing panel, and an inductive receive coil positioned within the chamber and adjacent an underside of the outer housing, the inductive receive coil operable with an external inductive charging coil to provide inductive powering to the portable tether device. The portable tether device also includes a communication circuit positioned within the chamber and powered by the inductive receive coil, with the communication circuit further including transmit and receive optical components that provide light-based communication between the portable tether device and the isolated industrial product and wireless communication circuitry configured to transmit and receive wireless signals to and from the portable tether device.

In accordance with another aspect of the invention, a wireless communications system for configuring and/or monitoring an isolated industrial product includes a status indicator light structure positioned within an opening of a housing panel of a housing containing the industrial product, the status indicator light structure further including an inductive charging coil and a communication circuit operably connected to the isolated industrial product, the communication circuit including transmit and receive optical components that provide light based communication. The wireless communications system also includes a portable tether device magnetically coupled to the housing panel and positioned over the status indicator light structure, the portable tether device further including an outer housing, an inductive receive coil positioned within the chamber and operable with the inductive charging coil to provide inductive charging to the portable tether device, and a communication circuit powered by the inductive receive coil, the communication circuit including transmit and receive optical components that provide light-based communication and wireless communication circuitry configured to transmit and receive wireless data signals. The transmit and receive optical components of the status indicator light structure and the transmit and receive optical components of the portable tether device are aligned with one another to enable light-based communication therebetween.

In accordance with yet another aspect of the invention, a method of configuring and/or monitoring an isolated industrial product using a portable tether device includes magnetically attaching a portable tether device to an outer panel of an enclosure housing the isolated industrial product, the portable tether device attached to the outer panel so as to be positioned over a status indicator light structure operably connected to the isolated industrial product. The method also includes establishing a light-based communication between the portable tether device and the status indicator light structure via the transfer of data-bearing light between transmit and receive optical components of the status indicator light structure and transmit and receive optical components of the portable tether device and wirelessly transmitting data signals between a remote user interface and the portable tether device to perform at least one of a monitoring and configuration of the isolated industrial product via the remote user interface. The data-bearing light relays command signals from the remote user interface to the status indicator light structure of the isolated industrial product via the portable tether device and relays monitoring data from the status indicator light structure of the isolated industrial product to the remote user interface via the portable tether device.

Various other features and advantages of the present invention will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

Embodiments of the invention are directed to a system and method for wireless configuring and monitoring industrial products and devices via a portable tether device. The tether device provides communications to an isolated product without requiring direct electrical connections thereto.

While an embodiment of the invention is shown and described below for use with a motor control center having a number of components or products clustered therein, it is recognized that embodiments of the invention may be used with a variety of types of industrial devices. That is, embodiments of the invention may also be directed to use with individual, isolated industrial devices not clustered together in a motor control center environment. Accordingly, the specific description of a motor control center and arrangement/use of a portable tether device therewith is not meant to limit the scope of the invention, and it is recognized that equivalents, alternatives, and modifications, aside from those expressly described herein, are possible and within the scope of the appending claims.

Figure 1:
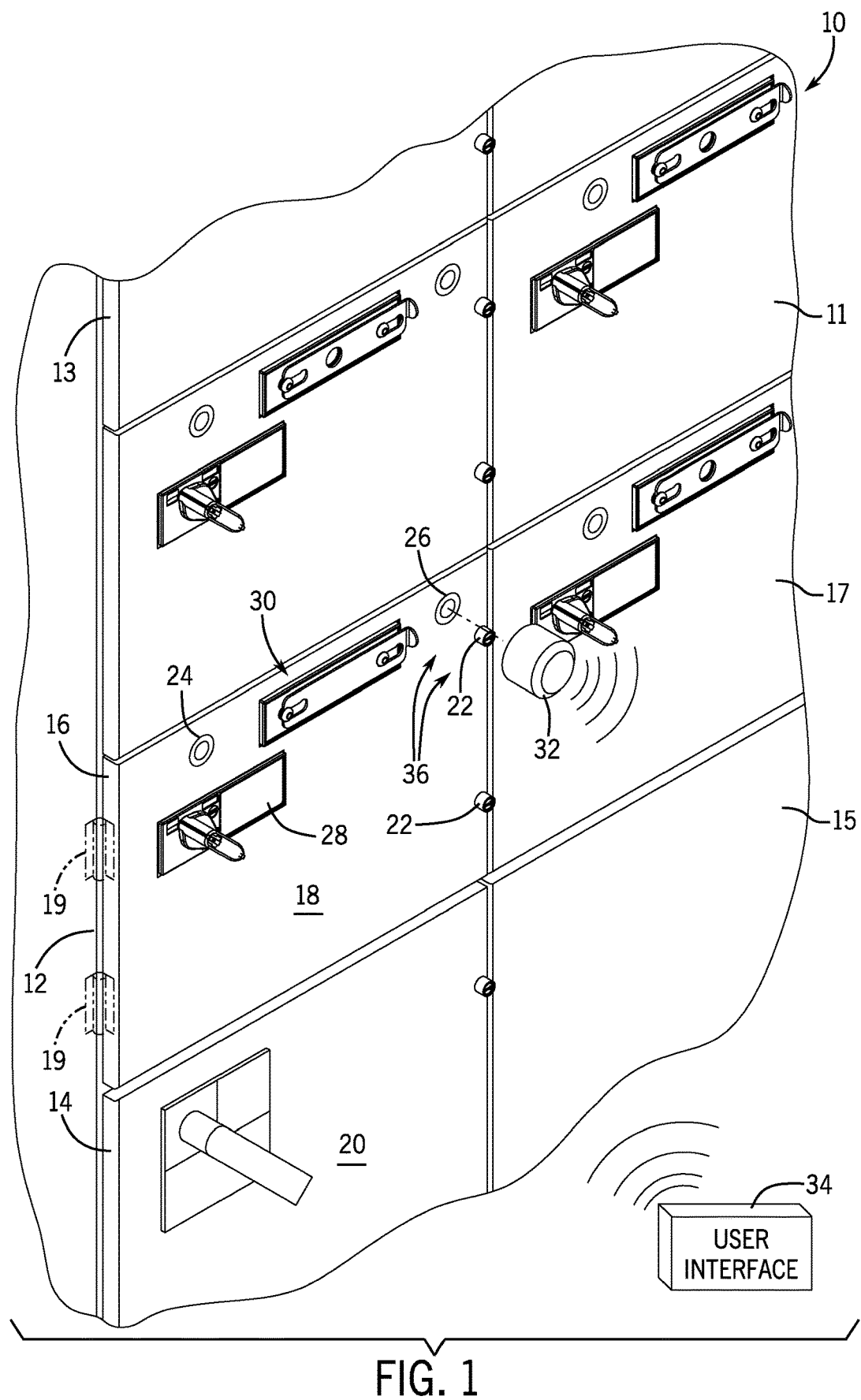
FIG. 1 is a partial perspective view of control modules installed in a motor control center, along with a portable tether device for wirelessly communicating with a control module and isolated industrial product(s) therein, according to an embodiment of the invention.

Referring to FIG. 1, a partial perspective view of a motor control center structure 10 is shown. As discussed above, motor control centers may include compartments or enclosures for multiple control modules or buckets 11, 13, 14, 15, 16, 17. Bucket 16 is shown fully installed into motor control center compartment or enclosure 12 such that its front panel 18 is sealed securely against the periphery of enclosure 12 and flush with the front panel 20 of bucket 14. In this regard, control module 16 includes a number of latching mechanisms 22 on front panel 18 so that an operator may lock control module 16 into place once installed. In some embodiments, front panel 18 may be a door having a set of hinges 19 in order to permit access to components within control module 16 while control module 16 is installed in enclosure 12 of motor control center 10. However, even when closed or sealed, front panel or door 18 still permits access to and visualization of component status indicator lights 24, 26, circuit breaker assembly 28 and a line contact actuator 30 for engaging line contacts (not shown) with line power from the motor control center 10.

According to an exemplary embodiment, and as shown in FIG. 1, one or more portable tether devices 32 are provided for use with the motor control center 10 that allow for wireless communication with and monitoring of products in the motor control center 10. That is, a portable tether device 32 enables wireless communication between the motor control center 10 (and products thereof) and a remotely located user interface 34 that provides for the configuration and monitoring of the products. As shown in FIG. 1 and as will be explained in greater detail below, the portable tether device 32 is a hockey puck sized device that is magnetically attached to the front panel 18 of control module 16 and operates in conjunction with a status indicator light 26 of a control module 16 to enable the wireless communication—with the portable tether device 32 and a respective status indicator light 26 with which it is paired collectively providing a wireless communication system 36 for a desired product or products in a control module 16 of the motor control center 10.

Figure 2:
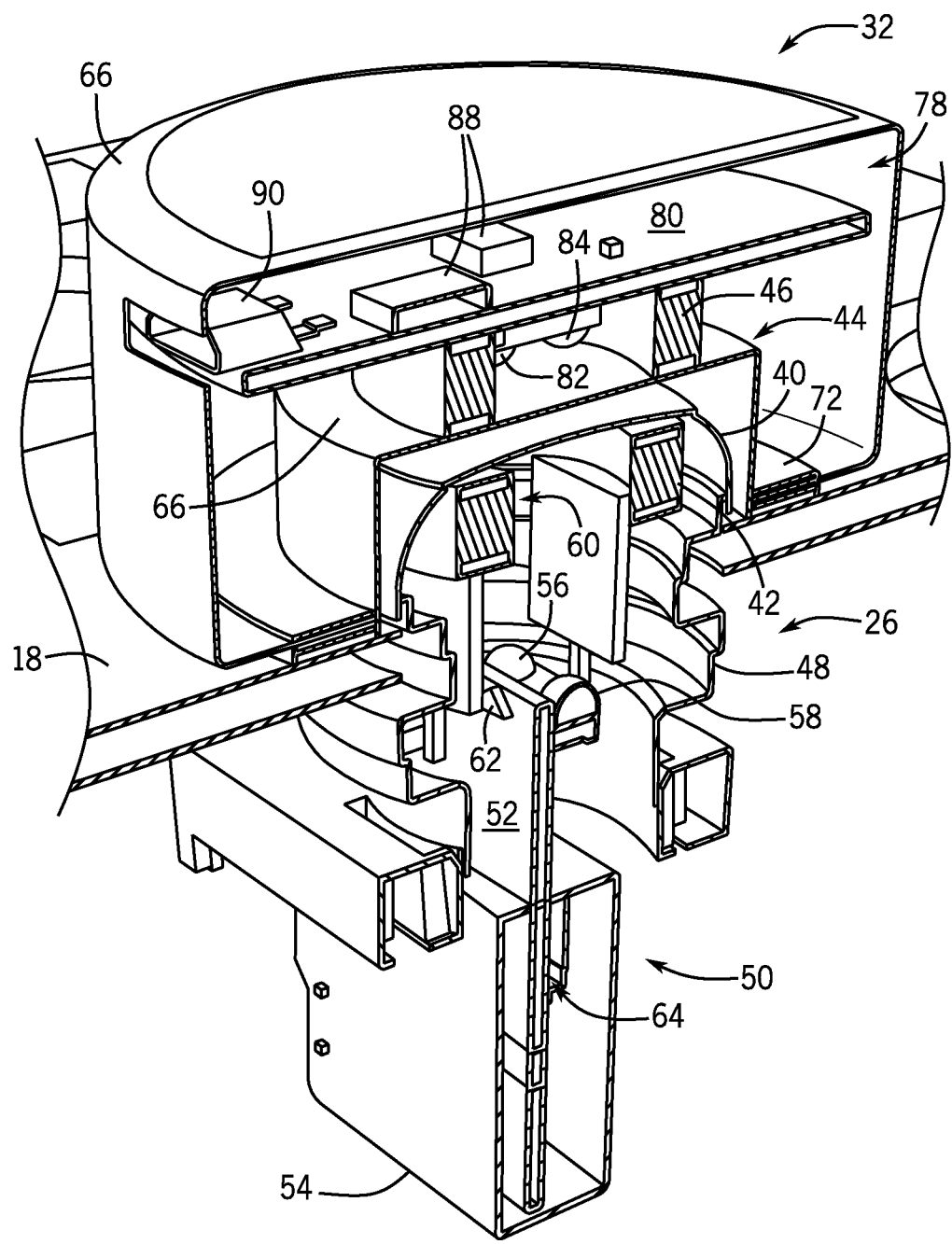
FIG. 2 is a cross-sectional view of the portable tether device of FIG. 1 as positioned over a status indicator light structure of a respective control module of the motor control center, according to an embodiment of the invention.

Referring now to FIGS. 2-5, detailed views of the portable tether device 32 and an indicator light 26 of a control module 16 of the motor control center 10 are provided, with positioning of the portable tether device 32 over the indicator light 26 being illustrated. Referring first to FIG. 2, the structure of indicator light 26 is illustrated in an exploded view. The indicator light structure 26 includes a lens 40 that extends out from front panel 18 of a respective control module 16. Positioned within lens 40 and adjacent thereto is a charging coil 42 that forms part of an inductive charger 44 (along with receive coil 46 provided as part of portable tether device 32). In the illustrated embodiment, the charging coil 42 is provided as a ring-shaped coil. The charging coil 42 may be retained in place by a mounting bracket 48 that allows for its positioning adjacent to lens 40, thereby allowing for the receive coil 46 of portable tether device 32 to be positioned in close proximity thereto upon attachment of the portable tether device 32 to the front panel 18. Although not shown in FIG. 2, charging coil 42 is coupled to at least one electrical energy source so as to energize the charging coil 42.

The indicator light structure 26 also includes a communication circuit 50 that may comprise a printed circuit board (PCB) 52 having a plurality of data transmission and processing devices therein. The PCB 52 may be aligned perpendicularly to the front panel 18 and secured in place via additional features on mounting bracket 48 or by a separate mounting structure. The PCB 52 provides for communication with one or more products 54 housed within a respective control module 16 of the motor control center 10, so as to provide for transmission of data from the products and the transmission of control commands to the products and thereby enable monitoring and configuration of the products.

The data transmission and processing devices on PCB 52 includes transmit and receive optical components 56, 58 that, in an exemplary embodiment, are in the form of a photodetector 56 and LED 58 that optically communicate with a corresponding photodetector and LED of the portable tether device 32, as will be explained in greater detail below. The optical components 56, 58 are positioned so as to be aligned with an opening 60 defined by charging coil 42, such that an open pathway between the optical components 56, 58 and the lens 40 is provided for optical signals to be transmitted out from optical components (i.e., from LED 58) and received by optical components (i.e., by photodetector 56) for communication with portable tether device 32 when the portable tether device 32 is magnetically attached to the front panel 18 about the indicator light 26. In an exemplary embodiment, an LED status light 62 is also included in indicator light structure 26 and is positioned adjacent optical components 56, 58. The LED status light 62 may perform a known function of generating visible light to illuminate the lens 40 of indicator light structure 26, so as to indicate an operational status of one or more products 54 in a respective control module 16 of motor control center 10.

The transmission and processing devices on PCB 52 also includes processing circuitry 64 that appropriately conditions and converts data-bearing electrical signal between different mediums and provides for transmission of data in a desired format, including the transmission of optical signals out to the portable tether device 32 and the receiving of optical signals from the portable tether device 32. The processing circuitry 64 may thus include components that provide suitable buffering, isolation, modulation/demodulation, amplification, and/or other conditioning that will provide appropriate voltage and power to adequately drive optical components into producing a data-bearing light transmission (e.g., visible light or infrared).

Figure 3:
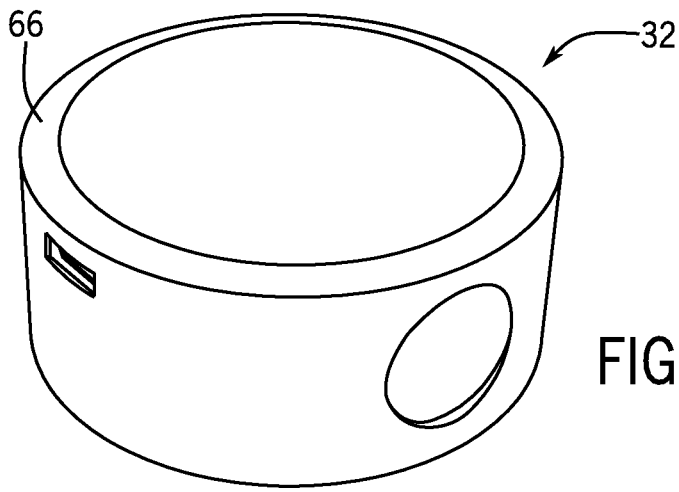
FIGS. 3-5 are various perspective views of the portable tether device of FIG. 1, according to an embodiment of the invention.
Figure 4:
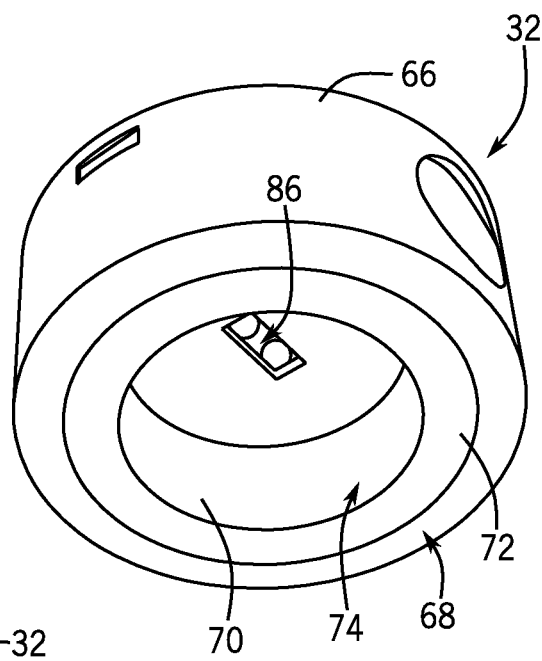
Figure 5:
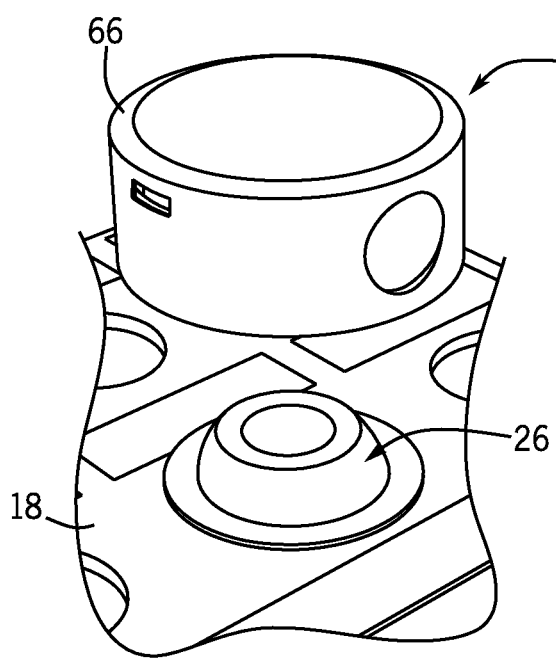

Referring still to FIG. 2 and also now to FIGS. 3-5, the portable tether device 32 is illustrated in greater detail. The portable tether device 32 includes an outer housing 66 that, according to one embodiment, has a cylindrical profile that gives the portable tether device 32 a hockey puck type shape. The outer housing 66 encloses the portable tether device 32 on side and top surfaces of the device and has a ring-shaped profile on an underside 68 of the portable tether device 32 so as to define a cavity 70 within which the indicator light 26 may be received. Positioned within outer housing 66 adjacent the underside 68 of the portable tether device 32 is a magnet 72 that secures the portable tether device 32 to the front panel 18. In one embodiment, the magnet 72 is a ring-shaped magnet that fits about a cylindrical recessed portion 74 of the outer housing 66 formed on the underside 68 thereof (and that defines cavity 70), such that the ring-shaped magnet 72 may be secured in place thereabout. The magnet 72 allows for attachment of the portable tether device 32 to front panel 18 of a respective control module 16 when the front panel 18 is formed of a suitably magnetic material. In an embodiment where the front panel 18 is formed of a non-magnetic material, a magnetic sticker ring 76 (FIG. 2) may be applied onto the front panel 18 to which the ring-shaped magnet 72 of the portable tether device 32 may be secured.

Portable tether device 32 also includes therein receive coil 46 that forms part of inductive charger (along with charging coil provided as part of indicator light) that provides power to the portable tether device 32. In one embodiment, the receive coil 46 is positioned within outer housing 66 and on the cylindrical recessed portion 74 thereof, which allows for the receive coil 46 to be positioned in proximity to the charging coil 42 of the indicator light structure 26. When energized, charging coil 42 acts as a transformer primary winding, and receive coil 46 acts as a transformer secondary winding. As charging and receive coils 42, 46 are brought into close proximity to one another such that charging and receive coils 42, 46 are substantially aligned and separated only by a minimal gap, as is done upon magnetic attachment of the portable tether device 32 to front panel 18, a relatively efficient electrical transformer results, thereby enabling contactor-less, inductive energy transfer between charging coil 42 and receive coil 46.

The receive coil 46 provides power to a communication circuit 78 of the portable tether device 32 that provides for wireless communication between the motor control center 10 (i.e., one or more products 54 of the motor control center 10) and the portable tether device 32 and between the portable tether device 32 and a remote user interface 34. As shown in FIG. 2, the communication circuit 78 may comprise a PCB 80 having a plurality of data transmission and processing devices therein. The PCB 80 may be positioned adjacent the receive coil 46, such as on a top surface thereof and in proximity to a top surface of the portable tether device 32. The plurality of data transmission and processing devices includes transmit and receive optical components 82, 84 that, in an exemplary embodiment, are in the form of a photodetector 82 and LED 84 that optically communicate with the photodetector 56 and LED 58 of the indicator light structure 26. The optical components 82, 84 are attached to a bottom side of the PCB 80 and are positioned thereon such that they are aligned with an opening 86 (FIG. 4) formed in cylindrical recessed portion 74 of outer housing 66. The optical components 82, 84 are thus positioned such that they may be in optical communication with the corresponding photodetector 56 and LED 58 of the indicator light structure 26 of a respective control module 16 when the portable tether device 32 is magnetically attached to the front panel 18 about the indicator light structure 26.

The transmission and processing devices on PCB 80 also include processing circuitry 88 that appropriately conditions and converts data-bearing electrical signal 1180 between different mediums and provide for transmission of data in a desired format, including the transmission of optical signals between the portable tether device 32 and product(s) 54 of the motor control center 10 and the transmission of wireless signals between the portable tether device 32 and the remote user interface 34. The processing circuitry 88 may thus include components that provide suitable buffering, isolation, modulation/demodulation, amplification, and/or other conditioning that will provide appropriate voltage and power to adequately drive optical components into producing a data-bearing light transmission and provide for generation and transmission of appropriate wireless signals from the communication circuit 78. The transmission and processing devices also include an antenna 90 of an appropriate type for broadcasting and receiving wireless signals to/from the portable tether device 32, with a wire monopole, printed inverted F antenna (PIFA), helix, or ceramic antenna being examples of such an antenna.

In an exemplary embodiment, the communication circuit 78 of portable tether device 32, and the transmission and processing devices thereof, is configured for Bluetooth™ pairing with the remote user interface for operation. As an example, the Bluetooth communication may have the following wireless transmission parameters: Bluetooth Transmission: Class 1; Bluetooth version: 2.0; Range: 300 Ft typical (free space); Frequency: 2.400-2.485 GHz; Max Transmit Power +6 dBm; Min Transmit Power −27 dBm; Receive Sensitivity Better than −86 dB. The communication circuit 78 is configured to transmit wireless signals conforming to the Bluetooth™ protocol to the remote user interface 34 and receive wireless signals conforming to the Bluetooth™ protocol from the remote user interface 34.

While the communication circuit 78 of portable tether device 32 is described above as configured for Bluetooth communication, it is recognized that other forms of wireless communication may be used between the portable tether device 32 and the remote user interface 34, and thus embodiments of the invention are not to be limited to only Bluetooth wireless communication. In another exemplary embodiment, Wi-Fi communication may be utilized for wireless local area networking between the portable tether device 32 and the remote user interface 34. The Wi-Fi communication may be according to IEEE 802.11 standards and use the 2.4 gigahertz UHF (802.11b and 802.11g) and 5 gigahertz SHF (802.11a) ISM radio bands.

Figure 6:
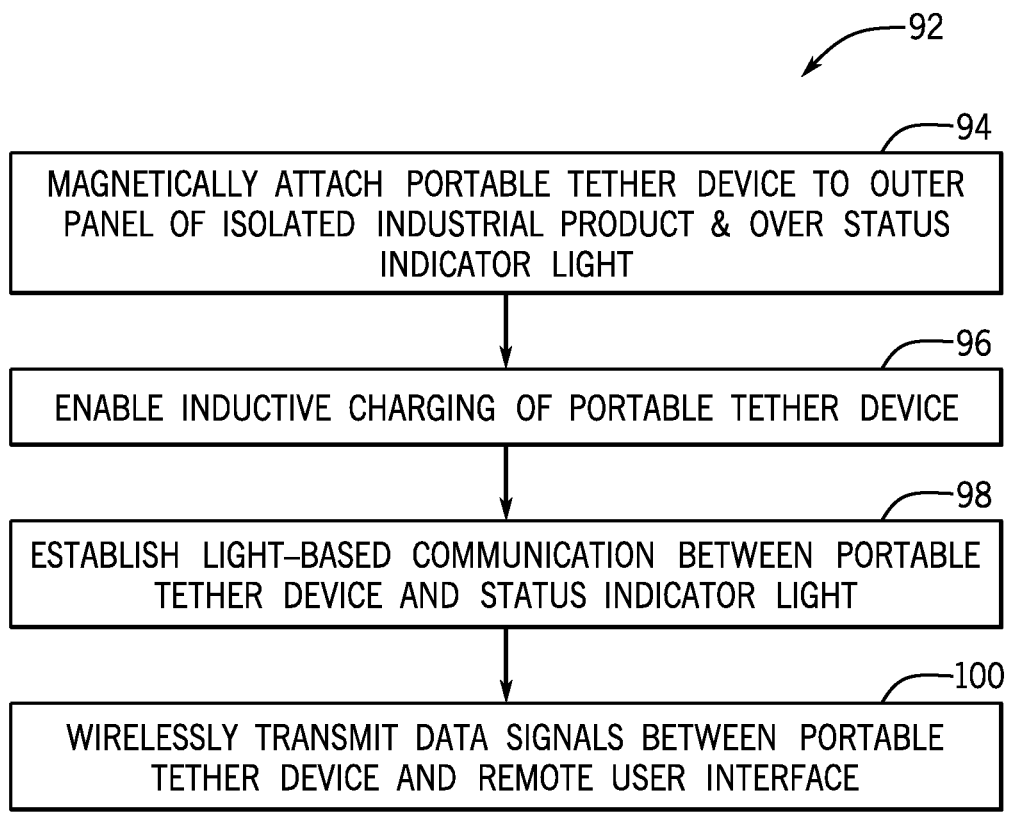
FIG. 6 is a flowchart illustrating a method of configuring and/or monitoring an isolated industrial product using the portable tether device of FIG. 1, according to an embodiment.

Referring now to FIG. 6, and with continued reference to FIGS. 1-5, a flowchart illustrating a method 92 of configuring and/or monitoring an isolated industrial product using a portable tether device is illustrated, according to an embodiment. In a first step of the method, a user first positions and magnetically attaches a portable tether device 32 to an outer panel 18 of an enclosure housing an isolated industrial product to be monitored, as indicated at STEP 94. As previously described, the magnetic attachment of portable tether device 32 to an outer panel 18 is achieved via a magnet 72 housed with an outer housing 66 of the portable tether device 32, with the magnet 72 either coupling directly with a panel formed of magnetic material or with a magnetic sticker ring 76 that may be applied onto the panel 18. In attaching the portable tether device 32 at STEP 94, the portable tether device 32 is attached to the outer panel 18 so as to be positioned over a status indicator light structure, such as indicator light structure 26 in FIG. 1.

The positioning of the portable tether device 32 over the indicator light structure 26 enables/establishes an inductive powering of the portable tether device 32, as indicated at STEP 96. That is, positioning of the portable tether device 32 over the indicator light structure 26 positions the receive coil 46 of the portable tether device 32 in proximity to the charging coil 42 of the status indicator light structure 26, so as to allow for inductive powering to occur. The charging coil 42 acts as a transformer primary winding and the receive coil 46 acts as a transformer secondary winding, resulting in a relatively efficient electrical transformer being formed upon alignment of the charging and receive coils 42, 46, thereby enabling contactor-less, inductive energy transfer between charging coil 42 and receive coil 46.

The positioning of the portable tether device 32 over the indicator light structure 26 also enables/establishes a light-based communication between the portable tether device 32 and the status indicator light structure 26 at STEP 98. More specifically, alignment of transmit and receive optical components 56, 58 of the status indicator light structure 26 and transmit and receive optical components 82, 84 of the portable tether device provides for the transfer of data-bearing light therebetween.

In conjunction with establishing a light-based communication between the portable tether device 32 and the status indicator light structure 26 at STEP 98, the method 92 also includes a step of wirelessly transmitting data signals between a remote user interface 34 and the portable tether device 32, as indicated at STEP 100. In an exemplary embodiment, the wireless communications is performed via a Bluetooth communication protocol, although it is recognized that other suitable wireless protocols (such as Wi-Fi) could also be employed in performing the wireless data transmission of STEP 100. In one embodiment, the wireless communication may be in the form of data being transmitted to the remote user interface 34 from portable tether device 32 as part of the remote user interface performing an ongoing monitoring of the industrial product—in which case data-bearing light would be provided from status indicator light structure 26 to portable tether device 32 (STEP 98) regarding a status/condition of the industrial product before the portable tether device 32 then wirelessly transmits such data to the remote user interface 34 for viewing/analysis by a user (STEP 100). In another embodiment, the wireless communication may be in the form of data being transmitted from the remote user interface 34 to portable tether device 32 as part of the remote user interface sending configuration commands to the industrial product—in which case the configuration commands would first be transmitted from the remote user interface 34 to portable tether device 32 (STEP 100) and then the light-based communication would occur (STEP 98), with data-bearing light being provided from the portable tether device 32 to the status indicator light structure 26 regarding the configuration of the industrial product to be performed. Thus it is seen that the ordering of STEPS 96 and 98 may vary based on the task being performed.

In performing STEPS 98 and 100, the communication circuits 50, 78 of the status indicator light structure 26 and portable tether device 32—and more particularly the processing circuitry 64, 88 thereof—may perform any required signal formatting, conversion and/or conditioning required for transmission and processing of data-bearing light and wireless signals received thereby or to be transmitted therefrom. Thus, for example, processing circuitry 64, 88 may be appropriate buffering, isolation, modulation or amplification circuitry which will provide appropriate voltage and power through drive signals to adequately drive the LED 58, 84 of the status indicator light structure 26 and/or portable tether device 32 into producing a data-bearing light transmission. Exemplary of common transmit circuitry are operational amplifiers (op-amps) and transistor amplifiers, though those skilled in the art of signal conditioning will recognize a plethora of optional circuits and components which might optionally be used in conjunction with the present invention. In one conceived embodiment, the data-bearing light transmission may further be modulated, using FM, AM, PWM, PPM, OFDM, QAM or other known modulation techniques. As another example, processing circuitry 64, 88 may comprise appropriate reception circuitry for receiving data-bearing light wave input signals detected by photodetectors 56, 82 and converting the data-bearing light wave input signals to a data-bearing electrical signal. Processing circuitry 64, 88 will appropriately condition, and may further convert data-bearing electrical signals, such as by demodulating the data-bearing electrical signals and performing suitable buffering, amplification, and other conditioning to yield a desired data signal. Processing circuitry 64, 88 may then perform further conversion of this data signal as required to provide a signal suitable for wireless transmission to user interface 34, for example.

Beneficially, embodiments of the invention thus provide a portable tether device that provides communications to an isolated product without requiring direct electrical connections thereto. The puck portable tether device may be magnetically attached to the face of an enclosure which houses the product, with the portable tether device being positioned over the top of an indicator light. The portable tether device may be powered through an inductive connection provided beneath the indicator light lens and communicates with the product via a light based communication also achieved through the indicator light lens. This allows a user to securely pair with a single device (the portable tether device), which may be quickly and easily moved from one product to another as desired by the user.

Accordingly, one embodiment of the present invention includes a portable tether device for configuring and/or monitoring an isolated industrial product includes an outer housing defining a chamber, a magnet positioned within the chamber to provide for magnetic attachment of the portable tether device to a housing panel, and an inductive receive coil positioned within the chamber and adjacent an underside of the outer housing, the inductive receive coil operable with an external inductive charging coil to provide inductive powering to the portable tether device. The portable tether device also includes a communication circuit positioned within the chamber and powered by the inductive receive coil, with the communication circuit further including transmit and receive optical components that provide light-based communication between the portable tether device and the isolated industrial product and wireless communication circuitry configured to transmit and receive wireless signals to and from the portable tether device.

Another embodiment of present invention includes a wireless communications system for configuring and/or monitoring an isolated industrial product includes a status indicator light structure positioned within an opening of a housing panel of a housing containing the industrial product, the status indicator light structure further including an inductive charging coil and a communication circuit operably connected to the isolated industrial product, the communication circuit including transmit and receive optical components that provide light based communication. The wireless communications system also includes a portable tether device magnetically coupled to the housing panel and positioned over the status indicator light structure, the portable tether device further including an outer housing, an inductive receive coil positioned within the chamber and operable with the inductive charging coil to provide inductive charging to the portable tether device, and a communication circuit powered by the inductive receive coil, the communication circuit including transmit and receive optical components that provide light-based communication and wireless communication circuitry configured to transmit and receive wireless data signals. The transmit and receive optical components of the status indicator light structure and the transmit and receive optical components of the portable tether device are aligned with one another to enable light-based communication therebetween.

In yet another embodiment of the present invention, a method of configuring and/or monitoring an isolated industrial product using a portable tether device includes magnetically attaching a portable tether device to an outer panel of an enclosure housing the isolated industrial product, the portable tether device attached to the outer panel so as to be positioned over a status indicator light structure operably connected to the isolated industrial product. The method also includes establishing a light-based communication between the portable tether device and the status indicator light structure via the transfer of data-bearing light between transmit and receive optical components of the status indicator light structure and transmit and receive optical components of the portable tether device and wirelessly transmitting data signals between a remote user interface and the portable tether device to perform at least one of a monitoring and configuration of the isolated industrial product via the remote user interface. The data-bearing light relays command signals from the remote user interface to the status indicator light structure of the isolated industrial product via the portable tether device and relays monitoring data from the status indicator light structure of the isolated industrial product to the remote user interface via the portable tether device.

The present invention has been described in terms of the preferred embodiment, and it is recognized that equivalents, alternatives, and modifications, aside from those expressly stated, are possible and within the scope of the appending claims.

What is claimed is:

1. A portable tether device for configuring and/or monitoring an isolated industrial product, the portable tether device comprising:
    an outer housing defining a chamber, wherein the outer housing is configured to attach the portable tether device to the isolated industrial product;
    an inductive receive coil positioned within the chamber and adjacent an underside of the outer housing, the inductive receive coil operable with an external inductive charging coil to provide inductive powering to the portable tether device; and
    a communication circuit positioned within the chamber and powered by the inductive receive coil, the communication circuit including:
        transmit and receive optical components that provide light-based communication that includes data between the portable tether device and an indicator light structure of the isolated industrial product; and
        wireless communication circuitry configured to transmit and receive wireless signals to and from the portable tether device, wherein
    the underside of the outer housing defines a cavity configured for placement over the indicator light structure of the isolated industrial product to provide an optical path for the light-based communication that includes data.

2. The portable tether device of claim 1 wherein the transmit and receive optical components are positioned within the chamber and adjacent an underside of the outer housing, with the transmit and receive optical components aligned with an opening formed in the underside of the outer housing.

3. The portable tether device of claim 1 wherein the transmit and receive optical components comprise:
    a light emitting diode (LED) configured to emit data-bearing light; and
    a photodetector configured to receive data-bearing light.

4. The portable tether device of claim 1 wherein the wireless communication circuitry is configured to transmit and receive wireless signals conforming to a Bluetooth™ or Wi-Fi wireless protocol.

5. The portable tether device of claim 1 further comprising processing circuitry configured to perform at least one of buffering, isolation, modulation, demodulation, amplification, and other signal conditioning to enable the light-based communication and the wireless communication, and conversion between light-based data signals and wireless data signals transmitted from and received by the portable tether device.

6. The portable tether device of claim 1 wherein the cavity defined by the underside of the housing is a cylindrical recessed portion, with the cylindrical recessed portion sized to accommodate positioning of a status indicator light of the isolated industrial product therein.

7. The portable tether device of claim 1 wherein the portable tether device is powered by and communicates with the isolated industrial product without any electrical connections to the isolated industrial product.

8. The portable tether device of claim 1 further comprising a magnet in the chamber, and wherein the magnet is configured to provide for magnetic attachment of the portable tether device to the isolated industrial product.

9. The portable tether device of claim 8 wherein the magnet comprises a ring-shaped magnet that fits about the cavity.

10. The portable tether device of claim 1 further comprising a magnet that is separate from the outer housing and is outside of the cavity, wherein, to attach the outer housing to the isolated industrial product, the magnet is positioned between the outer housing and a housing panel of the isolated industrial product.

11. The portable tether device of claim 1 wherein the isolated industrial product comprises a plurality of indicator light structures, each being associated with one of a plurality of control modules, and the cavity is configured is configured for placement over any one of the plurality of indicator light structures.

12. A wireless communications system for configuring and/or monitoring an isolated industrial product, the wireless communications system comprising:
 a status indicator light structure positioned within an opening of a housing panel of a housing containing an isolated industrial product, the status indicator light structure comprising:
  an inductive charging coil; and
  a communication circuit operably connected to the isolated industrial product, the communication circuit including transmit and receive optical components that provide light based communication; and
 a portable tether device magnetically coupled to the housing panel and positioned over the status indicator light structure, the portable tether device comprising:
  an outer housing;
  an inductive receive coil positioned within a chamber defined by the outer housing and operable with the inductive charging coil to provide inductive charging to the portable tether device; and
  a communication circuit powered by the inductive receive coil, the communication circuit including transmit and receive optical components that provide light-based communication and wireless communication circuitry configured to transmit and receive wireless data signals;
 wherein the transmit and receive optical components of the status indicator light structure and the transmit and receive optical components of the portable tether device are aligned with one another to enable light-based communication therebetween.

13. The wireless communications system of claim 12 wherein the status indicator light structure comprises:
 a lens positioned adjacent the housing panel; and
 a mounting bracket configured to retain the inductive charging coil therein and position the inductive charging coil in a volume defined by the lens, so as to be adjacent thereto.

14. The wireless communications system of claim 13 wherein the inductive charging coil comprises a ring-shaped coil having an opening defined thereby, and wherein the transmit and receive optical components of the status indicator light structure aligned with the opening such that data-bearing light may be transmitted from and received by the transmit and receive optical components through the lens.

15. The wireless communications system of claim 13 wherein the transmit and receive optical components comprise:
 a light emitting diode (LED) configured to emit data-bearing light; and
 a photodetector configured to receive data-bearing light.

16. The wireless communications system of claim 13 wherein the outer housing includes a cylindrical recessed portion formed on an underside thereof, with the cylindrical recessed portion sized to accommodate positioning of the lens therein.

17. The wireless communications system of claim 16 wherein the portable tether device comprises a magnet to secure the portable tether device to the housing panel, the magnet positioned adjacent the underside of the outer housing.

18. The wireless communications system of claim 12 wherein the outer housing includes an opening formed on an underside thereof, with the transmit and receive optical components of the portable tether device aligned with the opening to enable light-based communication between the status indicator light structure and the portable tether device.

19. The wireless communications system of claim 12 wherein each of the status indicator light structure and the portable tether device further comprise processing circuitry configured to perform at least one of buffering, isolation, modulation, demodulation, amplification, to enable processing of and conversion between light-based data signals and wireless data signals.

20. The wireless communications system of claim 12 wherein the wireless communication circuitry is configured to transmit and receive wireless signals conforming to one of a Bluetooth™ or Wi-Fi wireless protocol, to enable wireless communication between the portable tether device and a remote user interface device.

21. A method of configuring and/or monitoring an isolated industrial product using a portable tether device, the method comprising:
 magnetically attaching a portable tether device to an outer panel of an enclosure housing the isolated industrial product, the portable tether device attached to the outer panel so as to be positioned over a status indicator light structure operably connected to the isolated industrial product;
 powering the portable tether device via an inductive powering of the portable tether device, with the inductive powering occurring between a charging coil of the status indicator light structure and a receive coil of the portable tether device upon attachment of the portable tether device to the outer panel;
 establishing a light-based communication between the portable tether device and the status indicator light structure via the transfer of data-bearing light between transmit and receive optical components of the status indicator light structure and transmit and receive optical components of the portable tether device; and
 wirelessly transmitting data signals between a remote user interface and the portable tether device to perform at least one of a monitoring and configuration of the isolated industrial product via the remote user interface;

wherein the data-bearing light relays command signals from the remote user interface to the status indicator light structure of the isolated industrial product via the portable tether device and relays monitoring data from the status indicator light structure of the isolated industrial product to the remote user interface via the portable tether device.

22. The method of claim 21 wherein wirelessly transmitting data signals between the remote user interface and the portable tether device comprises transmitting and receiving wireless signals conforming to one of a Bluetooth™ or Wi-Fi wireless protocol, to enable wireless communication between the portable tether device and the remote user interface.

* * * * *